United States Patent
Waffenschmidt et al.

(10) Patent No.: US 9,698,761 B2
(45) Date of Patent: Jul. 4, 2017

(54) DYNAMIC RESONANT MATCHING CIRCUIT FOR WIRELESS POWER RECEIVERS

(75) Inventors: Eberhard Waffenschmidt, Aachen (DE); Adrianus Sempel, Waalre (NL); Dave Willem Van Goor, Nederweert eind (NL); Henricus Theodorus Van Der Zanden, Sint-Oedenrode (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 263 days.

(21) Appl. No.: 14/238,854

(22) PCT Filed: Aug. 6, 2012

(86) PCT No.: PCT/IB2012/054006
§ 371 (c)(1),
(2), (4) Date: Feb. 14, 2014

(87) PCT Pub. No.: WO2013/024396
PCT Pub. Date: Feb. 21, 2013

(65) Prior Publication Data
US 2014/0191818 A1    Jul. 10, 2014

Related U.S. Application Data

(60) Provisional application No. 61/666,040, filed on Jun. 29, 2012, provisional application No. 61/523,947, filed on Aug. 16, 2011.

(51) Int. Cl.
*H04B 5/00* (2006.01)
*H03H 7/38* (2006.01)
(Continued)

(52) U.S. Cl.
CPC ............. *H03J 1/00* (2013.01); *H01F 38/14* (2013.01); *H01P 1/10* (2013.01); *H02J 5/00* (2013.01);
(Continued)

(58) Field of Classification Search
CPC ...... H04B 5/0037; H04B 5/00; H04B 5/0012; H04B 5/0075; H01F 38/14; H03H 7/38; H01P 1/10
(Continued)

(56) References Cited

U.S. PATENT DOCUMENTS 5,898,579 A   4/1999  Boys et al.
8,093,758 B2 * 1/2012  Hussmann ............... H02J 1/00
                                                   307/105
(Continued)

FOREIGN PATENT DOCUMENTS

JP   H065851 A     1/1994
JP   2001297862 A  10/2001
(Continued)

OTHER PUBLICATIONS

Mitchell Kline; "Capacitive Power Transfer", Electrical Engineering and Computer Sciences, Univ. of California, Berklyey. Technical Report No. UCB/EECS-2010-155.

*Primary Examiner* — Benny Lee
*Assistant Examiner* — Jorge Salazar, Jr.
(74) *Attorney, Agent, or Firm* — Meenakshy Chakravorty (57) ABSTRACT

A resonant matching circuit (310) for matching a resonant frequency of a wireless power transfer system to a frequency of a power signal comprises a switch (311) connected in parallel with a resonant element (302) of the wireless power transfer system; and a controller (312) connected to the switch (311) and configured to detect a zero-voltage level crossing of a signal flowing through the resonant element
(Continued)

(302) and to close the switch (311) for a predefined amount of time upon detection of the zero-voltage level crossing, wherein closing the switch (311) for the predefined amount of time adds any one of an inductive value and a capacitive value to the resonant frequency of a wireless power transfer system.

15 Claims, 8 Drawing Sheets

(51) Int. Cl.
  *H01P 1/10* (2006.01)
  *H03J 1/00* (2006.01)
  *H02J 7/02* (2016.01)
  *H01F 38/14* (2006.01)
  *H02J 5/00* (2016.01)

(52) U.S. Cl.
  CPC ............... *H02J 7/025* (2013.01); *H03H 7/38* (2013.01); *H04B 5/0012* (2013.01); *H04B 5/0037* (2013.01); *H04B 5/0075* (2013.01)

(58) Field of Classification Search
  USPC ....... 333/17.1, 17.2, 32, 24 C, 262; 455/41.1
  See application file for complete search history.

(56) References Cited

U.S. PATENT DOCUMENTS

2008/0303289 A1    12/2008   Holliday
2011/0065398 A1     3/2011   Liu et al.

FOREIGN PATENT DOCUMENTS

| | | |
|---|---|---|
| JP | 2003509991 A | 3/2003 |
| JP | 2005151075 A | 6/2005 |
| JP | 2007501600 A | 1/2007 |
| JP | 2009296857 A | 12/2009 |
| JP | 2011114985 A | 6/2011 |
| WO | 9829919 A1 | 7/1998 |
| WO | 2010030195 A1 | 3/2010 |
| WO | 2010142434 A2 | 12/2010 |

* cited by examiner

DYNAMIC RESONANT MATCHING CIRCUIT FOR WIRELESS POWER RECEIVERS

This application claims the benefit of U.S. provisional patent application No. 61/523,947 filed Aug. 16, 2011 and U.S. provisional patent application No. 61/666,040 filed Jun. 29, 2012.

The invention generally relates to wireless power transfer systems and, more particularly, to techniques for dynamically adjusting the resonant frequency of such systems.

A wireless power transfer refers to supplying electrical power without any wires or contacts. Thus, the powering of electronic devices is performed through a wireless medium. One popular application for a wireless power transfer is charging portable electronic devices, e.g., mobile phones, laptop computers, and the like.

One technique for wireless power transfers is by an inductive powering system. In such a system, the electromagnetic inductance between a power source (transmitter) and a device (receiver) enables contactless power transfers. Both the transmitter and receiver are fitted with electrical coils, and when the coils are brought into physical proximity an electrical signal flows from the transmitter to the receiver.

In inductive powering systems, the generated magnetic field is concentrated within the coils. As a result, the power transfer to the receiver pick-up field is very concentrated in space. This phenomenon creates hot-spots in the system which limits the efficiency of the system. To improve the efficiency of the power transfer, a high quality factor for each coil is needed. To this end, the coil should be characterized with an optimal inductance to resistance ratio, be composed of materials with low resistance, and fabricated using a Litz-wire process to reduce skin-effect. The coils should also be designed to meet complicated geometries to avoid Eddy currents. Therefore, expensive coils are required for efficient inductive powering systems. A design for an inductive wireless power transfer system used for over a large area would need many expensive coils.

Figure 1:
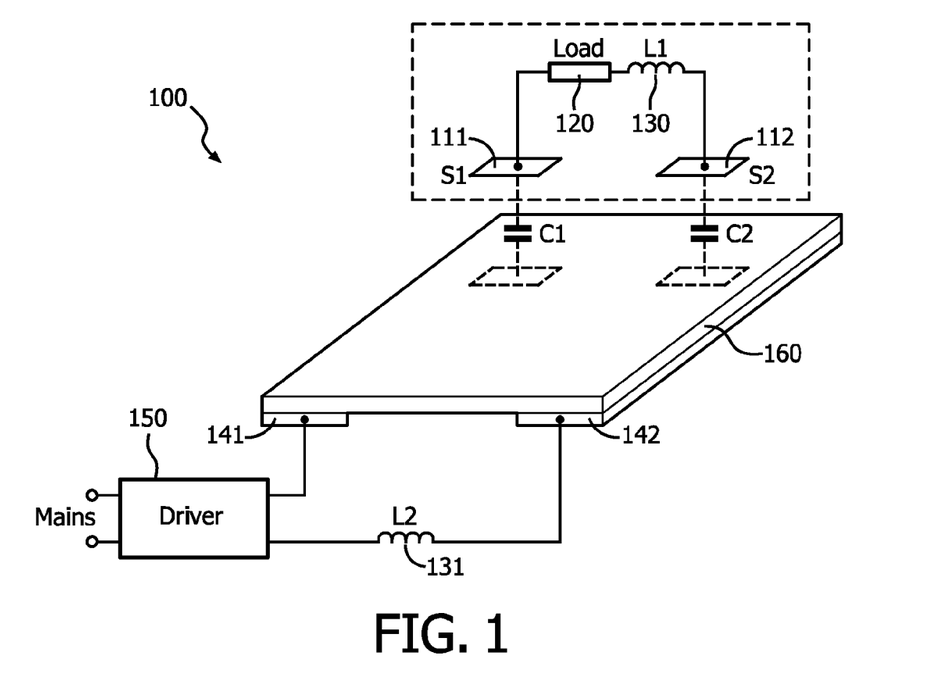
FIG. 1 is a diagram of a capacitive power transfer system.

Capacitive coupling is another technique for transferring power wirelessly. This technique is predominantly utilized in data transfers and sensing applications. A car-radio antenna glued on a window with a pick-up element inside the car is an example of a capacitive coupling. The capacitive coupling technique is also utilized for contactless charging of electronic devices. For such applications, the charging unit (implementing the capacitive coupling) operates at frequencies outside the inherent resonance frequency of the device. A capacitive power transfer system can also be utilized to transfer power over large areas having a flat structure, e.g., windows, walls, and the like. An example of such a capacitive power transfer system is system 100, depicted in FIG. 1. As illustrated in FIG. 1, a typical arrangement of such a system includes a pair of receiver electrodes 111, 112 connected to a load 120 and an inductor 130. The system 100 also includes a pair of transmitter electrodes 141, 142 connected to a power driver 150, and an insulating layer 160.

The pair of transmitter electrodes 141, 142 is located on one side of the insulating layer 160, and the receiver electrodes 111, 112 are located on the other side of the insulating layer 160. This arrangement forms capacitive impedance between the pair of transmitter electrodes 141, 142 and the receiver electrodes 111, 112.

Power driver 150 generates a power signal that can be wirelessly transferred from the transmitter electrodes 141, 142 to the receiver electrodes 111, 112 to power the load 120. The efficiency of the wireless power transfer improves when a frequency of the power signal matches a series-resonance frequency of the system 100. The series-resonance frequency of the system 100 is a function of the inductive value of the inductor 130 and/or inductor 131, as well as of the capacitive impedance between the pair of transmitter electrodes 141, 142 and the receiver electrodes 111, 112 (see C1 and C2 in FIG. 1). The capacitive impedance and the inductor(s) cancel each other out at the resonance frequency, resulting in a low-ohmic circuit. The load 120 may be, for example, a LED, a LED string, a lamp, a computer, loud speakers, and the like.

Figure 2:
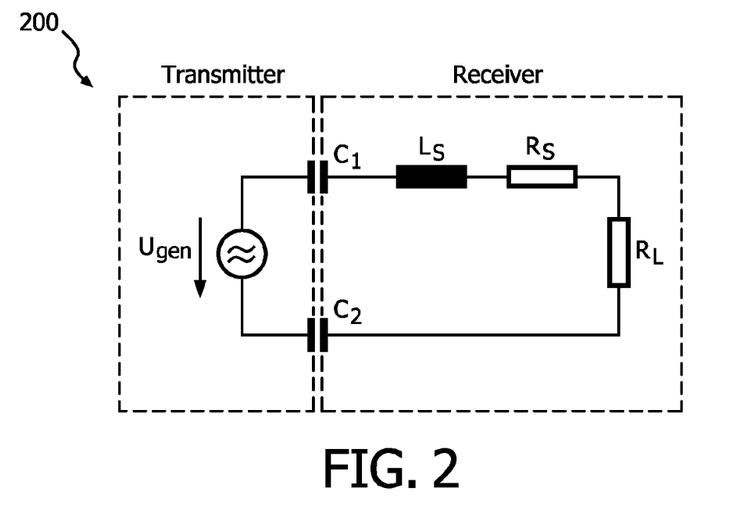
FIG. 2 is an electric diagram of the capacitive power transfer system.

An electric diagram 200 of the system 100 is provided in FIG. 2. The maximum power transfer is obtained when the frequency of the power signal $U_{gen}$ is close to the series-resonance of the circuit. The circuit is comprised of the load $R_L$, the resistor $R_S$ (representing the inductor resistance), capacitors $C_1$ and $C_2$, and inductor $L_S$. The series-resonance is determined by the values of the capacitors $C_1$ and $C_2$ and inductor $L_S$. The values of the capacitors $C_1$ and $C_2$ and inductor $L_S$ are selected such that they cancel each other out at the operating frequency of the signal $U_{gen}$. Therefore, only the series-resonance of the inductor $R_S$ and the connectivity of the electrodes limit the power transfer. It should be appreciated that this allows transferring AC signals characterized by high amplitude and low frequencies.

For both capacitive and inductive power transfer systems, power is efficiently transferred when the frequency of the input AC power matches the resonant frequency at the receiver. For example, in the capacitive system that includes an inductive element such as the system shown in FIGS. 1 and 2, the resonant frequency of the inductor(s) and the capacitive impedance should substantially match the frequency of the AC power signal.

One approach to match the resonant frequency of the receiver is to use variable resonant elements, e.g., variable inductors. However, such an approach may be bulky, expensive, or unavailable for an application. Another approach is to change the operational frequency of the power driver 150. However, this may not be a feasible solution in a system that includes multiple loads because the frequency cannot be dynamically adjusted to ensure that all loads in the system will have the same resonant frequency. For example, changing the power signal frequency to meet resonance frequency of a first load may result in taking a second device out of its resonance state. Thus, a solution is desired to match the resonance of a receiving circuit without changing the operational frequency of the power signal and without changing the resonant device's capacitive or inductive values.

Therefore, it would be advantageous to provide a solution for wireless power transfer systems that ensures an optimized power transfer by dynamically matching the resonance in such systems.

Certain embodiments disclosed herein include a resonant matching circuit for matching a resonant frequency of a wireless power transfer system to a frequency of a power signal. The circuit comprises a switch connected in parallel to a resonant element of the wireless power transfer system; and a controller connected to the switch and configured to detect a zero-voltage level crossing of a signal flowing through the resonant element and to close the switch for a predefined amount of time upon detection of the zero-voltage level crossing, wherein closing the switch for the predefined amount of time adds any one of an inductive value and a capacitive value to the resonant frequency of a wireless power transfer system.

Certain embodiments disclosed herein also include a resonant matching circuit for matching a resonant frequency of a wireless power transfer system to a frequency of a power signal. The circuit comprises a switch connected in series to a resonant element of the wireless power transfer system; a controller connected to the switch and configured to detect crossing of a zero current level of a signal flowing through the resonant element and to open the switch for a predefined amount of time upon detection of the zero current level crossing, wherein opening the switch for the predefined amount of time adds any one of an inductive value and a capacitive value to the resonant frequency of a wireless power transfer system.

Certain embodiments disclosed herein also include a resonant matching circuit for matching a resonant frequency of a capacitive power transfer system to a frequency of a power signal. The system comprises a switch connected in series to an inductive element of the capacitive power transfer system; a controller connected to the switch and configured to detect crossing of a zero current level of a signal flowing through the inductive element and to open the switch for a predefined amount of time upon detection of the zero current level crossing, wherein opening the switch for the predefined amount of time adds any one of an inductive value and a capacitive value to the resonant frequency of the capacitive power transfer system, wherein the resonant frequency is a function of the inductive element, a capacitive impedance formed between receiver electrodes and transmitter electrodes of the capacitive power transfer system, and any one of the inductive value and the capacitive value.

Certain embodiments disclosed herein also include a resonant matching circuit for matching a resonant frequency of a capacitive power transfer system to a frequency of a power signal. The circuit comprises a switch connected in parallel to an inductive element of the capacitive power transfer system; a controller connected to the switch and configured to detect crossing of a zero voltage level of a signal flowing through the inductive element and to close the switch for a predefined amount of time upon detection of the zero voltage level crossing, wherein closing the switch for the predefined amount of time adds any one of an inductive value and a capacitive value to the resonant frequency of a wireless power transfer system, wherein the resonant frequency is a function of the inductive element, a capacitive impedance formed between receiver electrodes and transmitter electrodes of the capacitive power transfer system, and any one of the inductive value and the capacitive value.

The subject matter that is regarded as the invention is particularly pointed out and distinctly claimed in the claims at the conclusion of the specification. The foregoing and other features and advantages of the invention will be apparent from the following detailed description taken in conjunction with the accompanying drawings.

It is important to note that the embodiments disclosed are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in plural and vice versa with no loss of generality. In the drawings, like numerals refer to like parts through several views.

Various embodiments disclosed herein include a matching resonant circuit designed to dynamically match the resonant frequency of a wireless power transfer system to the frequency of an AC power signal, without changing the AC power signal frequency. As discussed above, the power transfer is optimized when the resonant frequency of the system substantially matches the AC power signal's frequency.

Figure 3:
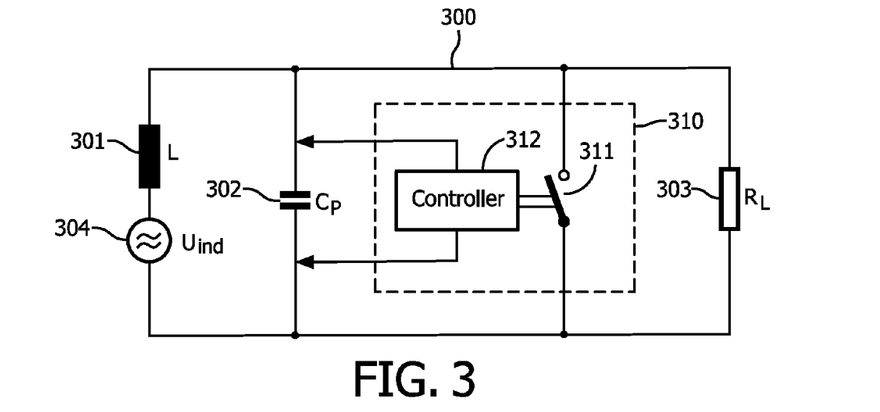
FIG. 3 is a schematic diagram illustrating an inductive power transfer receiver with a resonant matching circuit implemented according to one embodiment.

FIG. 3 depicts an exemplary and non-limiting electric circuit diagram of a receiver 300, which is a receiver of an inductive power transfer system. The receiver 300 includes a resonant frequency matching circuit 310 according to one embodiment. The receiver 300 further includes a capacitor (Cp) 302 that is connected in parallel to an inductor (L) 301. The inductor 301 and the capacitor 302 form the parallel-resonant frequency in the inductive power transfer system. The receiver 300 also includes a load ($R_L$) 303. Although not shown in FIG. 3, the load 303 typically includes an active rectifier, a smoothing capacitor, and the electrical element (e.g., a LED, a lamp, etc.) to which electrical power is delivered.

An alternating magnetic field from a transmitter side (not shown) induces a voltage in the inductor 301, which is represented by a voltage source $U_{ind}$ 304. The frequency of the voltage source $U_{ind}$ is equal to the operating frequency, i.e., the frequency of the generated AC signal from the transmitter side. However, the resonant frequency of the inductor 301 and capacitor 302 does not match the operating frequency. In an embodiment, the resonant frequency is slightly higher than the operating frequency.

According to one embodiment, the resonant matching circuit 310 is connected in parallel with the capacitor 302 and the load 303. The resonant matching circuit 310 includes a switch 311 and a controller 312 that controls the operation of the switch 311. Specifically, in one embodiment, the controller 312 detects a zero-voltage crossing at the capacitor 302, i.e., a transition from a positive potential to a negative potential, and vice versa. When a zero-voltage crossing is detected, the controller 312 closes the switch 311 for a predefined period of time.

The controller 312 can be realized using one or more analog comparators having outputs provided to a pulse generator. The pulse generator produces a short pulse upon a crossing of a zero voltage value. Thus, the short pulse closes and opens the switch 311 upon detection of a zero-voltage crossing. The duration of the short pulse is adjusted at the pulse generator. Other implementations of the controller 312 to detect zero-voltage crossing will be apparent to one of ordinary skill in the art.

The switch 311, when closed, provides a short across the load 303. As noted above, the switch 311 is closed for a predefined period of time upon detecting a zero-voltage crossing. In one embodiment, the predefined time period is typically shorter than half of the period of the operating frequency. If the switch 311 is closed shortly after the zero-voltage crossing, the short circuit current has a virtual capacitive component. On the other hand, by closing the switch just before the zero-voltage crossing, the short circuit current has a virtual inductive component. Each of the virtual imaginary inductive and capacitive components has the effect of an additional virtual capacitor or virtual inductor. The value of each of the virtual imaginary inductive and capacitive components is a function of the predefined period of time during which the switch is closed, which is controlled by the controller 312. Thus, by adjusting the duration of time that the switch 311 is closed, the value of each of the virtual imaginary inductive and capacitive components can be set such that the circuit is in resonance at the operating frequency.

Particularly, when the switch 311 is closed shortly after a positive zero-voltage crossing (i.e., a crossing from a negative potential to a positive potential), a short positive current pulse is generated. The frequency component of this short positive current pulse has a phase shift of nearly −90° with respect to the phase of the voltage source $U_{ind}$ 304. This corresponds to an additional capacitive current, which is added to the resonant circuit consisting of the inductor 301 and the capacitor 302. Thus, the switch 311 is considered a virtual capacitor that reduces the overall resonant frequency of the capacitive system (as defined above). The duration of the short positive current pulse (i.e., the amount of time that the switch is closed) determines the amplitude of the current, and thus the value of the virtual capacitor. If the switch 311 is closed shortly before a zero-voltage crossing, a current short pulse is generated in the opposite direction. Thus, the fundamental frequency of the current pulse has a phase shift of +90° with respect to the phase of the voltage source $U_{ind}$ 304. This corresponds to a virtual inductor that increases the resonance frequency.

Therefore, by adjusting the duration of the short pulse (i.e., the time that the switch 311 remains closed) and the timing for closing the switch 311 (i.e., before or after zero-voltage crossing) the series-resonance frequency of the wireless power transfer system may be matched to the operational frequency of the power signal.

The operation of the series-resonance frequency matching circuit 310 will be further described with reference to FIG. 4, which illustrates the operation of the resonant circuit 310 in the time domain.

If the resonant circuit 310, consisting of an inductor 301 and a capacitor 302, can freely oscillate, then the resonant period is completed at a certain time. Optimally, the end of the excitation cycle would be aligned with the beginning of each resonant cycle. However, in the case shown in FIG. 4, an excitation cycle 410 is slightly longer than a resonant cycle 420. According to the embodiments disclosed herein, the resonant cycle 420 is delayed such that a new resonant cycle starts at the same time as a new excitation cycle. During this delay time, the state of the current and voltage of the resonant circuit must be conserved, such that after the delay time, the circuit behaves just like before the delay began. The state of the resonant circuit is "frozen" for that delay time by controlling the operation of the switch 311, as discussed above.

Figure 4:
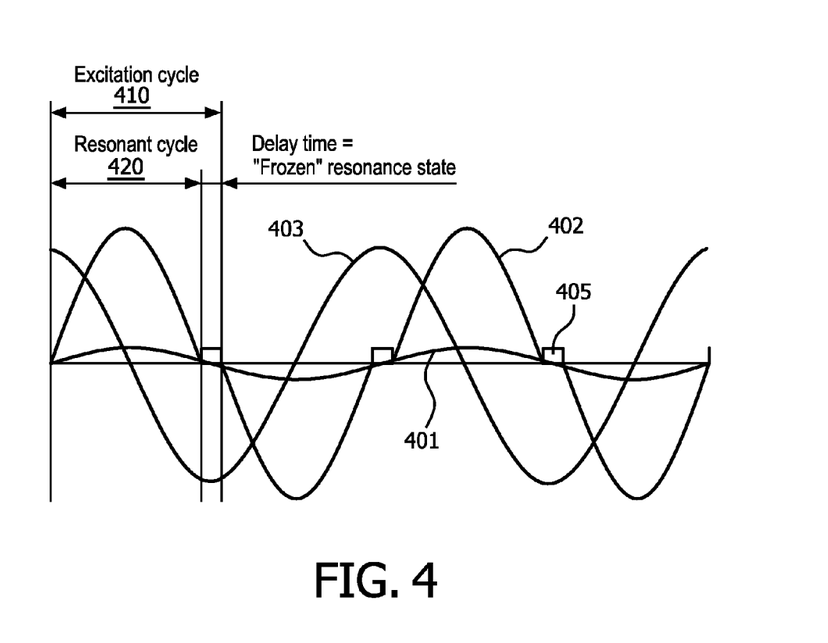
FIG. 4 is a graph illustrating the operation of the resonant matching circuit.

As depicted in FIG. 4, a curve 401 represents the excitation period of induced source voltage $U_{ind}$ 304 (FIG. 3). One half-cycle is indicated as the excitation cycle 410 in FIG. 4. A curve 402 corresponds to the resonant voltage across the capacitor 302 (FIG. 3). The half-cycle of the capacitor resonant voltage ends before the excitation cycle 410. This is characterized by the voltage potential at the capacitor 302 reaching a zero voltage value. At this state, the resonant current through the inductor 301, illustrated as a curve 403, reaches its maximum value.

To "freeze" this state until the next excitation cycle starts, the switch 311 closes, as indicated by a switch signal 405. As long as the switch 311 is closed, the voltage across the capacitor 302 remains at zero, and the current through the inductor 301 remains at its maximum value. The moment the excitation cycle is reached, the switch 311 is opened again, by asserting the switch signal 405. Then, the resonance state of the circuit consisting of the inductor 301 and capacitor 302 is matched to the excitation cycle again.

Figure 5:
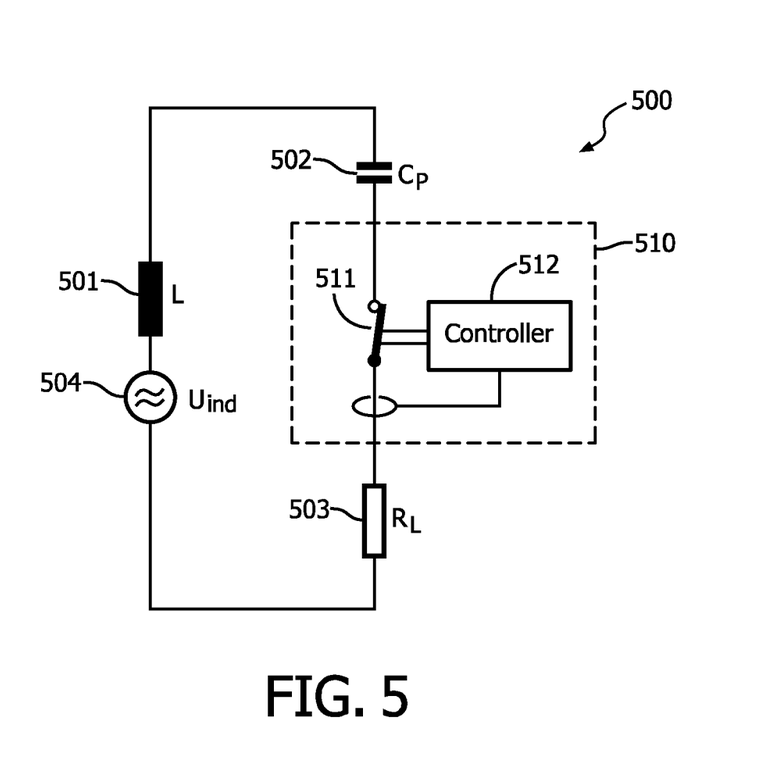
FIG. 5 is an electrical diagram illustrating an inductive power transfer receiver with a resonant matching circuit implemented according to another embodiment.

FIG. 5 shows an exemplary non-limiting electric circuit diagram of a receiver 500, which may be implemented in an inductive power transfer system. According to this embodiment, the receiver 500 includes a resonant matching circuit 510, an inductor 501, a capacitor 502, and a load 503. Although not shown in FIG. 5, the load 503 typically includes a rectifier, a smoothing capacitor, and an electrical element (e.g., a LED, a lamp, etc.) to which electrical power is delivered. The resonant matching circuit 510 performs dynamic parallel-resonance frequency matching and includes a switch 511 as well as a controller 512 that controls the operation of the switch 511. An alternating magnetic field from a transmitter side (not shown) induces voltage in the inductor 501, which is represented by a voltage source 504. The frequency of the $U_{ind}$ 504 signal is equal to the operating frequency. The resonance frequency of the inductor 501 and capacitor 502 does not match the operating frequency of the $U_{ind}$ 504 signal.

According to this embodiment, the resonant matching circuit 510 is connected in series with the capacitor 502 and the load 503. The controller 512 detects when the current flowing through the capacitor 502 crosses a zero level current (i.e., no current). When the current is zero, the controller 512 opens the switch 511 for a predefined amount of time. When the switch 511 is opened, the capacitor 502 is charged at the maximal voltage. Thereafter, the controller 512 closes the switch 511, and as a result, the capacitor 502 can be discharged, and the next resonant cycle starts. The amount of time for keeping the switch 511 open can be adjusted. In an exemplary embodiment, this time period is a time that is shorter than half of the period of the operating frequency.

Closing the switch 511 before a resonant cycle is finished forces the resonant frequency of the receiver 500 into a different state, which equals the final state of the resonant cycle. Thus, by closing the switch 511 the resonant cycle, which is longer than the excitation cycle, may be abbreviated to match the excitation cycle.

In the resonant matching circuit 510, the operation of opening and closing the switch 511 upon a crossing of zero-current generates a voltage pulse. The voltage pulse is added to the resonant voltage, which may have an inductive or capacitive voltage component depending whether the voltage pulse is generated before or after the detection of a zero-current crossing. The generation of an additional inductive or capacitive voltage corresponds to an additional variable virtual inductor or capacitor. The additional variable virtual inductor or capacitor can be used to match the resonance frequency of the receiver 500 to the operating frequency of the power signal. The controller 512 can be realized using one or more analog comparators such that their outputs are provided to a pulse generator.

Figure 6A:
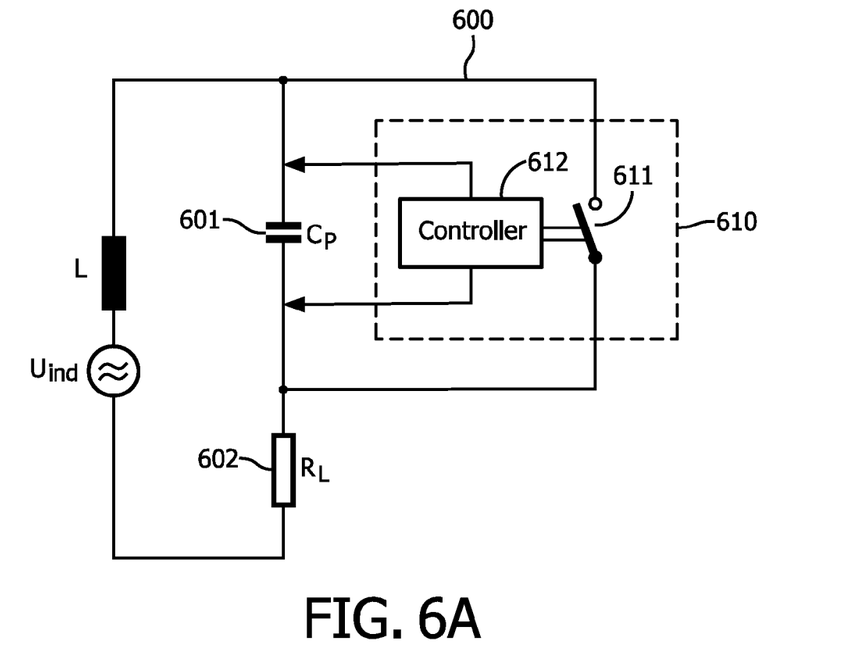
FIGS. 6A and 6B are electrical diagrams illustrating exemplary connections of a zero-voltage crossing-based resonant matching circuit in an inductive power transfer receiver.

The resonant matching circuits which are based on detection of zero crossings of voltage and current can be connected in different arrangements from those illustrated in FIGS. 3 and 5. For example, as depicted in FIG. 6A, a receiver 600 includes a zero-voltage crossing-based resonant matching circuit 610 connected in parallel with a capacitor 601, and in series with a load 602. In the FIG. 6A arrangement, the controller 612 detects a zero-voltage crossing at the capacitor 601 and switches the switch 611 upon detection of such a crossing, as discussed in detail above.

Figure 6B:
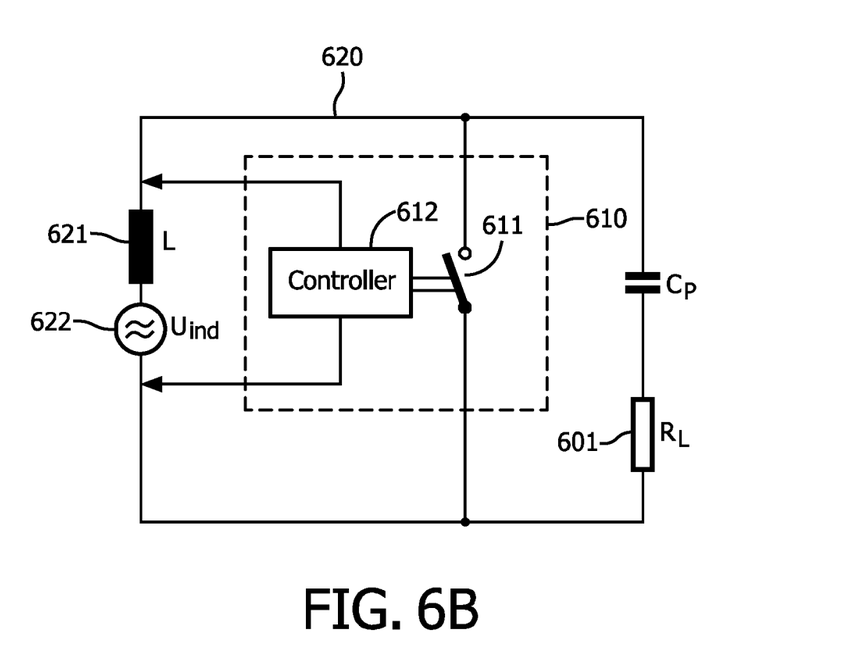

In another possible arrangement, illustrated in FIG. 6B, a receiver 620 includes a zero-voltage crossing-based resonant matching circuit 610 connected in parallel to an inductor 621 and an induced voltage source 622 of the receiver 620. In the FIG. 6B arrangement, the controller 612 detects a zero-voltage crossing of the voltage across the inductor 621 and switches the switch 611 upon the zero voltage crossing as discussed above. In the arrangements illustrated in FIGS. 6A and 6B, the receivers 610 and 620 are series resonant circuits.

Figure 7A:
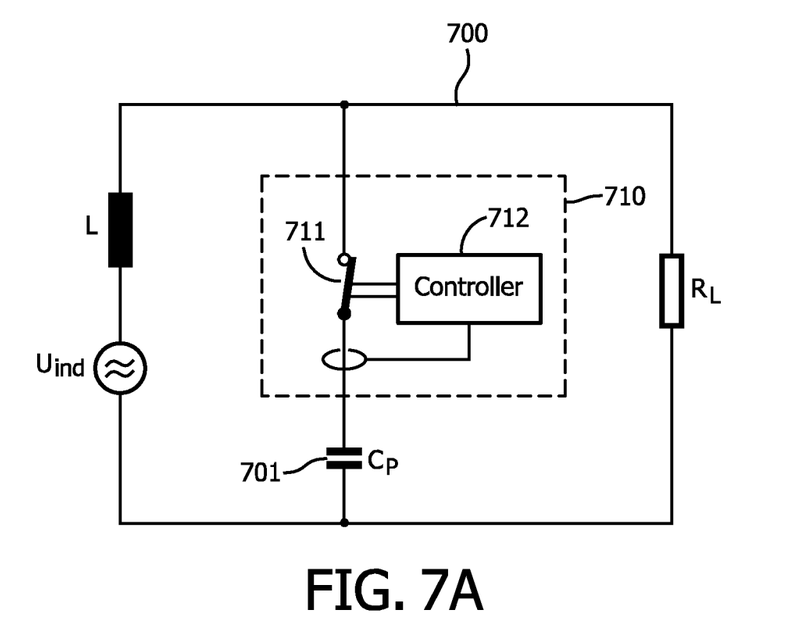
FIGS. 7A and 7B are electrical diagrams illustrating exemplary connections of a zero-voltage crossing-based resonant matching circuit in an inductive power transfer receiver.
Figure 7B:
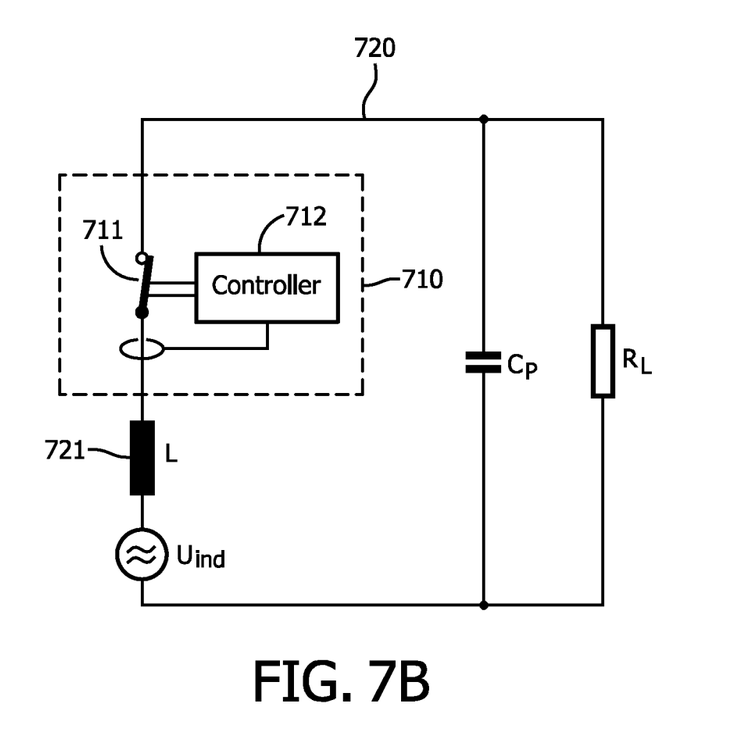

FIGS. 7A and 7B illustrate non-limiting arrangements of a zero-current crossing-based resonant matching circuit 710 included in resonant receiver circuits 700 (FIG. 7A) and 720 (FIG. 7B).

In FIG. 7A, the receiver 700 includes the resonant matching circuit 710 connected in series to a capacitor 701. The controller 712 detects changes of the current flow through the capacitor 701 and switches a switch 711 around the zero level current flow, as discussed above.

In the arrangement shown in FIG. 7B, the receiver 720 includes the resonant matching circuit 710 connected in series to an inductor 721. The controller 712 detects changes of current flow through the inductor 721 and switches the switch 711 around the zero level current flow, as discussed above.

The resonant matching circuits discussed herein can also be operable in capacitive power transfer systems, such as the system discussed above with reference to FIGS. 1 and 2. Various embodiments for connecting the resonant matching circuits in a capacitive power transfer system are described below with reference to FIGS. 8, 9 and 10.

As noted above, the resonance frequency of the capacitive power transfer system is a function of the capacitive impedance formed between the transmitter and receiver electrodes and the inductive elements of such a system. The capacitive impedance between the transmitter and receiver electrodes is illustrated as C1 and C2 in FIGS. 8, 9, and 10.

Figure 8:
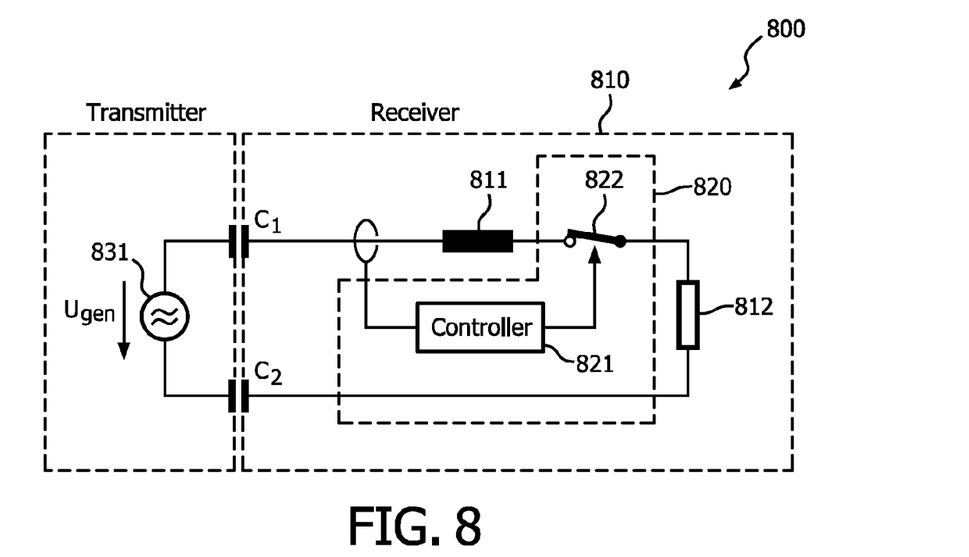
FIGS. 8, 9 and 10 are electrical diagrams illustrating capacitive power transfer systems with a resonant matching circuit implemented according to various embodiments.

In the exemplary and non-limiting electrical diagram shown in FIG. 8, in a receiver 810 of a capacitive power transfer system 800, a resonant matching circuit 820 is connected in series between an inductor 811 and a load 812. The resonant matching circuit 820 includes a controller 821 and a switch 822. Similar to the operation of the matching circuit 500, the controller 821 detects a zero level crossing of the current flowing through the inductor 811. When the current is zero, the controller 821 opens the switch 822.

In the resonant matching circuit 820, the operation of opening and closing the switch 822 upon detecting a zero level crossing current generates a voltage pulse at the switch 822. The voltage pulse is added to the resonant voltage and may have a phase shift relative to the phase of the current, depending on whether the pulse appears before or after the zero level crossing of the current. This way, an additional inductive or capacitive voltage is generated which is effectively an additional variable virtual inductor or capacitor. The additional virtual inductive or capacitive values may be implemented to match the resonance frequency of the receiver 810 to the operating frequency of the power signal generated by a power driver 831.

Figure 9:
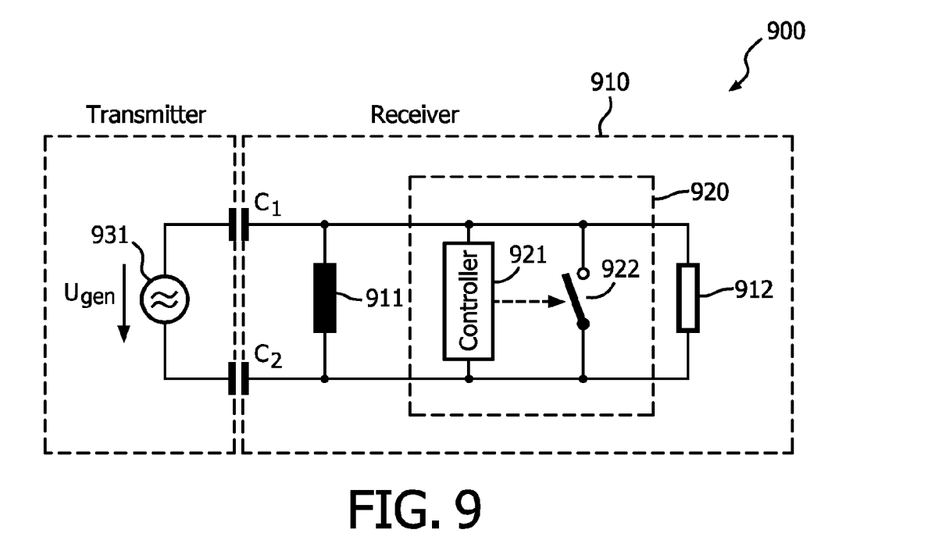

In another embodiment shown in FIG. 9, in a receiver 910 of a capacitive power transfer system 900, a resonant matching circuit 920 is connected in parallel with an inductor 911 and a load 912. The resonant matching circuit 920 includes a controller 921 and a switch 922. The controller 921 detects the voltage level on the inductor 911 in order to detect a zero-voltage crossing. Upon detection of a zero-voltage crossing, the controller 921 closes the switch 922 for a predefined amount of time. This amount of time is typically shorter than half of the period of the operating frequency of an AC power signal generated by a power driver 931. When the switch 922 is closed, a short is caused across the load 912. If the switch closing period is immediately after the zero transition, the short circuit current has a virtual capacitive component. If the switch 922 is closed before the zero transition, the short circuit current has a virtual inductive component. This virtual imaginary component has the effect of an additional virtual capacitor or inductor, thus matching the resonant frequency of the receiver 910 to the operating frequency of the AC power signal. As noted above, by varying the length of the pulse causing the short circuit, the virtual inductive/capacitive value can be set such that the receiver circuit is in resonance at operating frequency of the AC power signal generated by a power driver 931.

Figure 10:
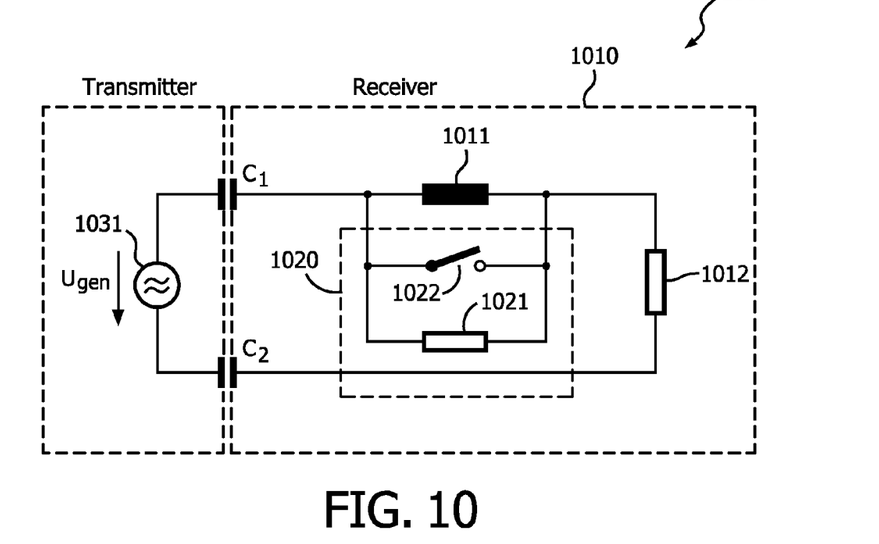

FIG. 10 shows a capacitive power transfer system 1000 that includes a receiver 1010 and a resonant matching circuit 1020. In the embodiment illustrated in FIG. 10, the resonant matching circuit 1020 is connected in parallel with an inductor 1011. The parallel combination is connected in series to a load 1012. The resonant matching circuit 1020 includes a controller 1021 and a switch 1022.

In the configuration illustrated in FIG. 10 an additional virtual inductive value is generated by closing the switch 1022 when a zero-voltage level crossing of a power signal is detected by the controller 1021 of the resonant matching circuit 1020. The power signal is an AC signal generated by the power driver 1031. The switch 1022 is closed for a predefined amount of time which is typically shorter than half of the period of the operating frequency of the AC power signal.

Figure 11:
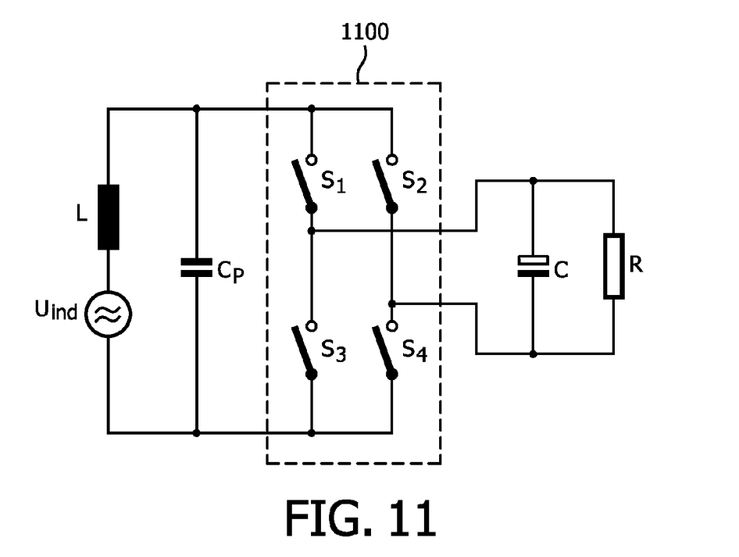
FIG. 11 is a diagram illustrating an active rectifier designed to perform the switching operation of the resonant matching circuit according to an embodiment.

In one embodiment of the invention, the operation of the switch included in any of the resonant matching circuits discussed above, can be performed by an active rectifier. As noted above, a load of the wireless power transfer system typically includes an active rectifier, a smoothing capacitor, and the electrical element (e.g., a LED, a lamp, etc.) to which electrical power is delivered. Typically, a rectifier is utilized to convert an AC signal to a DC signal and is implemented using a diode-bridge. In the exemplary embodiment, illustrated in FIG. 11, an active rectifier 1100 is implemented using active switches (S1, S2, S3, and S4) instead of diodes of a diode-bridge. By implementing active switches as illustrated in FIG. 11 the switch operation of any of the resonant matching circuits described above, can be achieved by closing two switches (S1, S2, S3, and S4) at the same time, such that they cause a short across the capacitor C.

Figure 12A:
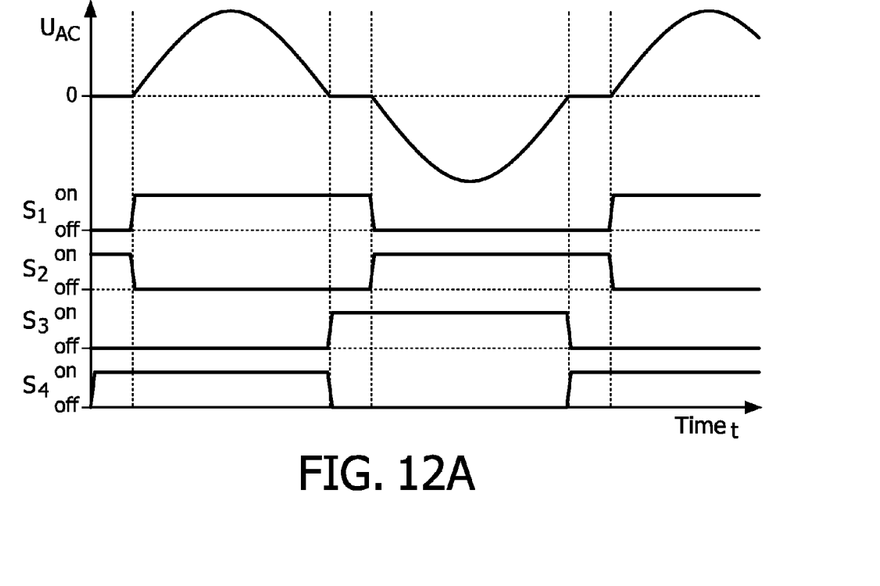
FIGS. 12A and 12B illustrate exemplary switching patterns of the active rectifier.

The switching pattern for the switches (S1, S2, S3, and S4) of the active rectifier 1100 for a zero-voltage crossing-based operation is illustrated in FIG. 12A.

Figure 12B:
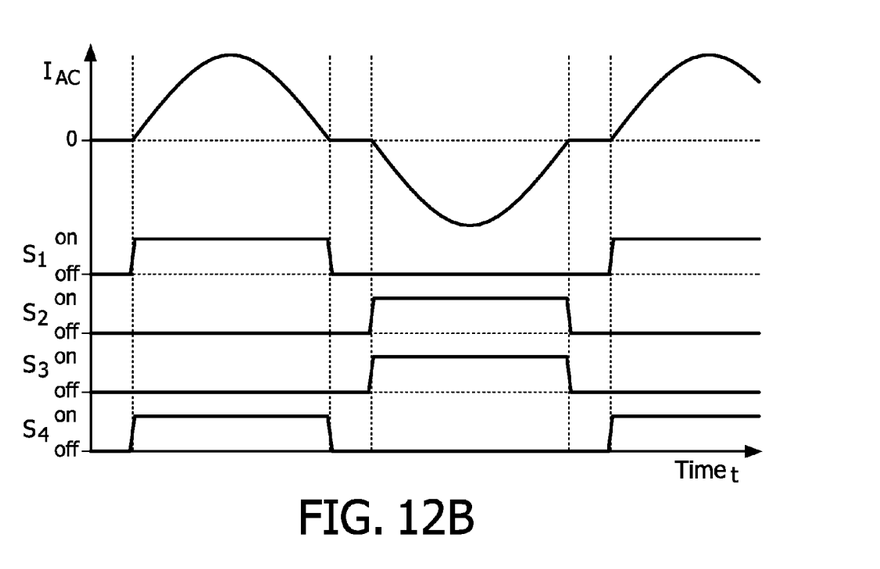

The switching pattern for the switches (S1, S2, S3, and S4) of the active rectifier 1100 for a zero-current crossing-based operation is illustrated in FIG. 12B.

In another embodiment, the switch of the resonant matching circuit, for example as illustrated in any of the embodiments disclosed in detail above, can be used for modulating a data signal over the power signal. This is achieved by asymmetrically switching the switch around a zero voltage crossing, such that an additional real component of the current flows. This current component can be used to generate a load modulation signal to transfer data to the transmitter side of the wireless power transfer system.

It should be noted that the resonant matching circuit, in any of the embodiments disclosed in detail above, can be connected in a capacitive power transfer system or in an inductive power transfer system that includes a plurality of receivers. Accordingly, the resonance frequency of each receiver is controlled by its resonant matching circuit. As a result, the resonance frequencies of the plurality of receivers can be independently matched to the operational frequency of the power signal.

While various embodiments have been described at some length and with some particularity, the invention should not be limited to any such particulars or embodiments or any particular embodiment, but it is to be construed with references to the appended claims so as to provide the broadest possible interpretation of such claims in view of the prior art and, therefore, to effectively encompass the intended scope of the invention. Furthermore, the foregoing describes the invention in terms of embodiments foreseen by the inventor for which an enabling description was available, notwithstanding that insubstantial modifications of the invention, not presently foreseen, may nonetheless represent equivalents thereto.

What is claimed is:

1. A resonant matching circuit for matching a resonant frequency of a wireless power transfer system to a frequency of a power signal, comprising:
    a switch connected in parallel with a resonant element of the wireless power transfer system; and
    a controller connected to the switch and configured to detect a zero-voltage level crossing of a second signal flowing through the resonant element and to close the switch for a predefined amount of time upon detection of the zero-voltage level crossing, wherein closing the switch for the predefined amount of time initiates a freezing of said second signal at the time at which said closing is initiated and adds any one of an inductive value and a capacitive value to the resonant frequency of the wireless power transfer system.

2. The circuit of claim 1, wherein the switch is closed immediately prior to the zero-voltage level crossing or immediately after the zero-voltage level crossing.

3. The circuit of claim 1, wherein the predefined amount of time is less than half of the period of the frequency of the power signal.

4. The circuit of claim 1, wherein the wireless power transfer system is any one of a capacitive power transfer system and an inductive power transfer system.

5. A resonant matching circuit for matching a resonant frequency of a wireless power transfer system to a frequency of a power signal, comprising:
    a switch connected in series with a resonant element of the wireless power transfer system; and
    a controller connected to the switch and configured to detect crossing of a zero current level of a second signal flowing through the resonant element and to open the switch for a predefined amount of time upon detection of the zero current level crossing, wherein opening the switch for the predefined amount of time adds any one of an inductive value and a capacitive value to the resonant frequency of the wireless power transfer system.

6. The circuit of claim 5, wherein the switch is opened immediately prior to the zero current level crossing or immediately after the zero current level crossing.

7. The circuit of claim 5, wherein the predefined amount of time is less than half of the period of the frequency of the power signal.

8. The circuit of claim 5, wherein the wireless power transfer system is any one of a capacitive power transfer system and an inductive power transfer system.

9. A resonant matching circuit for matching a resonant frequency of a capacitive power transfer system to a frequency of a power signal, comprising:
    a switch connected in series with an inductive element of the capacitive power transfer system; and
    a controller connected to the switch and configured to detect crossing of a zero current level of a second signal flowing through the inductive element and to open the switch for a predefined amount of time upon detection of the zero current level crossing, wherein opening the switch for the predefined amount of time adds any one of an inductive value and a capacitive value to the resonant frequency of the capacitive power transfer system, wherein the resonant frequency is a function of the inductive element, a capacitive impedance formed between receiver electrodes and transmitter electrodes of the capacitive power transfer system, and any one of the inductive value and the capacitive value.

10. The circuit of claim 9, wherein the predefined amount of time is less than half of the period of the frequency of the power signal.

11. A resonant matching circuit for matching a resonant frequency of a capacitive power transfer system to a frequency of a power signal, comprising:
    a switch connected in parallel with an inductive element of the capacitive power transfer system; and
    a controller connected to the switch and configured to detect crossing of a zero voltage level of a second signal flowing through the inductive element and to close the switch for a predefined amount of time upon detection of the zero voltage level crossing, wherein closing the switch for the predefined amount of time adds any one of an inductive value and a capacitive value to the resonant frequency of the capacitive power transfer system, wherein the resonant frequency is a function of the inductive element, a capacitive impedance formed between receiver electrodes and transmitter electrodes of the capacitive power transfer system, and any one of the inductive value and the capacitive value.

12. The circuit of claim 11, wherein the predefined amount of time is less than half of the period of the frequency of the power signal.

13. The circuit as in claim 11, wherein the switching operation of the switch is performed by an active rectifier.

14. A wireless power transfer system comprising a plurality of receivers, wherein each receiver of the plurality of receivers includes a respective resonant matching circuit of claim 11 to independently match the resonant frequency of the corresponding receiver.

15. The circuit as in claim 11, wherein the switch is further configured to modulate a data signal over the power signal.

\* \* \* \* \*